US007319220B2

(12) United States Patent
Soltesz et al.

(10) Patent No.: US 7,319,220 B2
(45) Date of Patent: Jan. 15, 2008

(54) TRANS-IMPEDANCE AMPLIFIER WITH OFFSET CURRENT

(75) Inventors: Dario Soltesz, Irvine, CA (US);
Cristiano Bazzani, Irvine, CA (US);
Wim Cops, Juan les Pins (FR)

(73) Assignee: Mindspeed Technologies, Inc., Newport Beach, CA (US)

( * ) Notice: Subject to any disclaimer, the term of this patent is extended or adjusted under 35 U.S.C. 154(b) by 106 days.

(21) Appl. No.: 11/392,175

(22) Filed: Mar. 29, 2006

(65) Prior Publication Data

US 2007/0228257 A1 Oct. 4, 2007

(51) Int. Cl.
*G01J 1/44* (2006.01)
*H03F 3/08* (2006.01)
*H01L 31/00* (2006.01)
*H01J 40/14* (2006.01)

(52) U.S. Cl. .................. 250/214 A; 330/308; 327/514; 250/214 R

(58) Field of Classification Search ............ 250/214 A, 250/214.1, 214 R; 327/514; 330/308
See application file for complete search history.

(56) References Cited

U.S. PATENT DOCUMENTS

2002/0140506 A1 * 10/2002 Kobayashi ................... 330/85
2006/0197452 A1 * 9/2006 Zhang ......................... 315/32

* cited by examiner

*Primary Examiner*—Davienne N. Monbleau
*Assistant Examiner*—Brian J Livedalen
(74) *Attorney, Agent, or Firm*—Gardere Wynne Sewell LLP

(57) ABSTRACT

A trans-impedance amplifier receives an input current and is operable to generate an output voltage responsive to the input current. The amplifier is responsive to an increased range of input currents and has a wide bandwidth. The amplifier includes an input stage having a first and a second transistor and is configured to receive the input current. The amplifier includes an output stage coupled to the input stage and having a third and a fourth transistor. A variable resistor is coupled to the output stage to adjust the amount of current in the output stage. A variable current source is coupled to the output stage and is operable to adjust the amount of current in the output stage. A output driver, which is coupled to the output stage, includes at least another transistor. The output driver is operable to provide the output voltage and is operable to reduce the output impedance of the amplifier.

16 Claims, 4 Drawing Sheets

TRANS-IMPEDANCE AMPLIFIER WITH OFFSET CURRENT

FIELD OF THE INVENTION

The invention relates generally to communication systems. In particular, the invention relates to a trans-impedance amplifier for current to voltage conversion in communication systems.

BACKGROUND OF THE INVENTION

Trans-Impedance Amplifiers (TIAs) are used for current to voltage conversion in communication systems. For example, in optical communication systems, TIAs are used for current to voltage conversion in a power control loop to control a LASER or a Light Emitting Device (LED). The terms "LED" and "LASER" are used interchangeably hereinafter. The power contained in the light emitted by the LED is controlled by adjusting the current supplied to the LED. The TIAs are used in many other applications besides power control in a communication system.

FIG. 1 illustrates a Power Control Loop 100 used in a communication system. Light emitted by a LED 104 is detected by a monitor photo detector 108. The photo detector 108 converts the light into a current 112, the amount of the current 112 being proportional to the power contained in the light. The current 112 is received by a Trans-Impedance Amplifier (TIA) 116, which generates a voltage 120 responsive to the current 112. A comparator circuit 124 compares the voltage 120 to a reference voltage 128. If the voltage 120 is higher than the reference voltage 128, the comparator circuit 124 instructs a laser driver 132 to increase the current supplied to the LED 104. If the voltage 120 is lower than the reference voltage 128, the comparator circuit 124 instructs the Laser Driver 132 to decrease the current supplied to the LED 104. Accordingly, the laser driver 132 adjusts the current supplied to the LED 104.

As will be understood by those skilled in the art, in order to precisely control the LED power, the TIA 116 must maintain its linearity error below a desired percentage. Also, the TIA 116 must have the necessary bandwidth to be responsive to the high-speed output of the LED 104. If the output of the LED 104 is 2.5 Gb/s, but the TIA 116 has a low bandwidth (e.g., 100 MHz bandwidth), the TIA 116's output will contain error. Also, the output current from different photo detectors often vary even when the photo detectors are paired with the same LED because of variations in process and manufacture. Thus, the TIA 116 must be able to operate with the same speed and accuracy for a wide range of input currents from the photo detector 108. Also, as will be understood by those skilled in the art, the parasitic capacitance of the photo detector 108 can vary significantly and can often be as high as 15 pF. The variation of the parasitic capacitance of the photo detector 108 is caused by the reverse bias variation of the photo detector 108 and also caused by the fact that system manufacturers frequently change photo detectors. Thus, the TIA 116 must be tolerant of the variations of the parasitic capacitance.

Several variations of TIAs are currently being used. FIG. 2 illustrates a TIA 200 with a high gain differential amplifier and a negative feedback. A photo detector 204 detects light emitted by a LED (not shown in FIG. 2) and generates a current Iin 208. An operational amplifier 212 is coupled to the photo detector 204. The operational amplifier 212 has a non-inverting input terminal 216, an inverting input terminal 220, and an output terminal 224. A feedback resistor 228 is connected between the output terminal 224 and the inverting input terminal 220 of the operational amplifier 212. A bias voltage $V_{bias}$ 232 is connected to the non-inverting input terminal 216. The output voltage signal is $-I_{in}*R$.

In order for the TIA 200 to have high speed capability (i.e., large bandwidth), the operational amplifier 212 must have a large bandwidth. For example, if a several hundred MHz TIA bandwidth is desired, the operational amplifier 212 must have a bandwidth of several GHz, which is difficult to achieve. Also, when different photo detectors 204 are used, different currents may be generated by the photo detectors even when paired with the same LED. For example, if the output current of the photo detector 204 increases by a factor of 3, the feedback resistor 228 value must be decreased accordingly so that the output voltage of the operational amplifier 212 is not distorted. However, if the feedback resistor 228 becomes too small, the amplifier bandwidth may not be large enough to ensure stability. Thus, adjusting the feedback resistor value to achieve linearity across a desired input current range affects the stability of the circuit. Furthermore, if the photo detector 204 is replaced with another that has a different parasitic capacitance, the operational amplifier 212 may not have enough bandwidth to ensure stability.

FIG. 3 illustrates a TIA 300 with a current mirror. A photo detector 304 generates a current Iin 308 responsive to light emitted by a LED (not shown in FIG. 3). A current mirror circuit is coupled to the photo detector. The current mirror circuit is formed by two NMOS transistors 312 and 316 and a resistor 324. The transistor 312 is supplied with a bias current Ibias 320 from a supply voltage $V_{dd}$ 322. The transistor 316 is connected to the voltage $V_{dd}$ 322 via the resistor 324. The gate and the drain of the transistor 312 are shorted. The current flowing into the transistor 312 is equal to $(I_{in}+I_{bias})$. If the transistors 312 and 316 have the same size, the output voltage $V_{out}$ 328 is equal to $V_{dd}-R*(I_{bias}+I_{in})$. The signal portion of the output voltage is equal to $-R*I_{in}$. However, if the transistor 316's size is X times the transistor 312's size, then $V_{out}$ 328$=V_{dd}-X*R*(I_{bias}+I_{in})$ and the signal portion of the output voltage is $-X*R*I_{in}$.

The TIA 300 lacks a large bandwidth because the parasitic capacitance (not shown in FIG. 3) of the photo detector 304 is added to the parasitic capacitances of the transistors 312 and 316. Also, while the TIA 300 provides good linearity because the load resistor 322 can be programmed independently, especially if a cascaded structure is used, the bandwidth of the TIA 300 is dependent on the input impedance. To mitigate the variation of the input impedance, and therefore the bandwidth, the current Ibias 320 is added to the input current. However, the addition of the current $I_{bias}$ 320 causes the current through the load resistor 324 to increase, thereby reducing the available voltage swing for the signal at the output node 328.

Accordingly, there is a need for a TIA that does not suffer from the foregoing disadvantages. There is a need for a high-speed TIA that operates with accuracy in response to a wide range of input currents.

SUMMARY OF THE INVENTION

A trans-impedance amplifier receives an input current and is operable to generate an output voltage responsive to the input current. The amplifier is responsive to an increased range of input currents and has a wide bandwidth. The amplifier includes an input stage having a first and a second transistor and is configured to receive the input current. The amplifier includes an output stage coupled to the input stage and having a third and a fourth transistor. A feedback loop is coupled to the input stage. The feedback loop is operable to reduce the input impedance of the amplifier. A variable resistor is coupled to the output stage to adjust the amount of current in the output stage. A variable current source is coupled to the output stage and is operable to adjust the amount of current in the output stage. A output driver, which is coupled to the output stage, includes at least a sixth transistor. The output driver is operable to provide the output voltage and is operable to reduce the output impedance of the amplifier.

BRIEF DESCRIPTION OF THE DRAWINGS

The following detailed description of the invention will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 4:
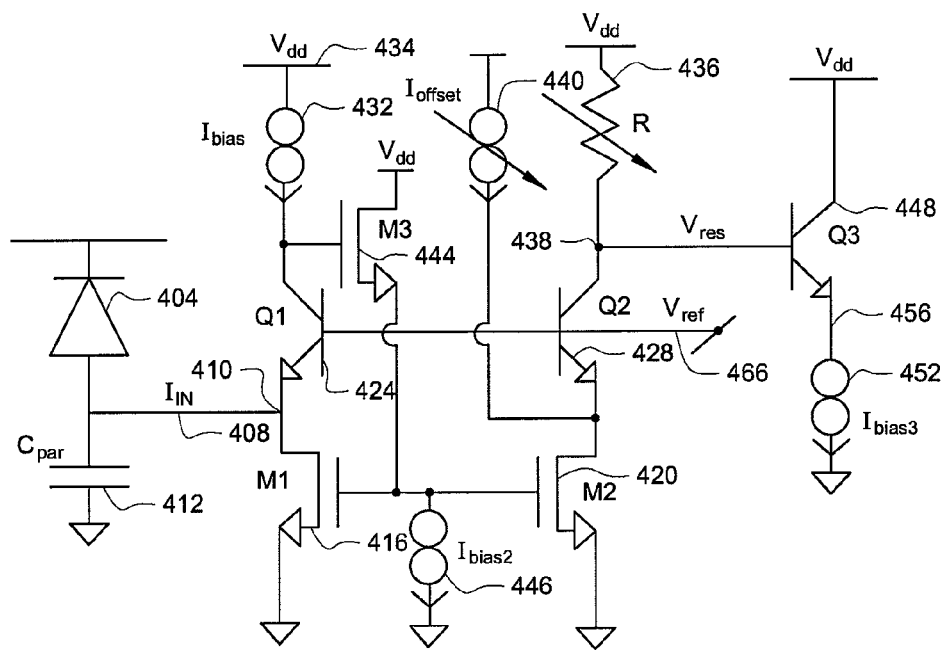
FIG. 4 is a TIA in accordance with one embodiment of the invention.

FIG. 4 is a TIA 400 in accordance with one embodiment of the invention. As will be explained further, the TIA 400 includes a low impedance input stage decoupled from a low impedance output stage, thereby providing a high speed response. The TIA 400 also exhibits stability under a wide range of input currents.

A photo detector 404 generates a current $I_{in}$ 408 responsive to light emitted by a LASER or a LED (not shown in FIG. 4). The terms "LASER" and "LED" are used interchangeably hereinafter. A parasitic capacitance $C_{par}$ 412 is associated with the photo detector 404. The input current $I_{in}$ 408 is supplied to a current mirror formed by two NMOS transistors 416 and 420 and two bipolar transistors 424 and 428. The input stage of the current mirror comprising the transistors 416 and 424 also receives a bias current $I_{bias}$ 432 from a supply voltage $V_{dd}$ 434. The bias current Ibias 432 provides the necessary current to properly bias the input stage comprising transistors 416 and 424.

As will be understood by those skilled in the art, the current flowing through the transistor 416 is mirrored in the transistor 420. The transistor 424 is used as a cascode transistor, which reduces the TIA 400's input impedance.

A CMOS transistor 444 creates a feedback loop around the input stage. The transistor 444 (implemented either as a CMOS or a bipolar transistor) also acts as a level shifting transistor. In one embodiment of the TIA wherein all transistors are bipolar transistors, the level shifting transistor 444 ensures that the transistor 424 remains in the linear region and does not saturate. In another embodiment of the invention wherein all transistors are CMOS transistors, the level shifting transistor 444 allows the transistor 424 to operate at a higher $V_{DSAT}$, thereby providing higher speed.

A bias current $I_{bias2}$ 446 is connected between the source of the transistor 444 and ground. The bias current $I_{bias2}$ 446 provides the necessary current to bias the transistor 444.

The output stage of the current mirror comprises a variable resistor 436 and the transistors 420 and 428. The variable resistor 436 is coupled between the transistor 428 and the supply voltage $V_{dd}$ 434. By adjusting the value of the variable resistor 436, the voltage $V_{res}$ at the node 438 is controlled. In one embodiment, the variable resistor 436 is a programmable resistor that allows the resistance value to be adjusted and the trans-impedance gain of the TIA changed according to the input current $I_{in}$ 408.

A bias voltage $V_{ref}$ 466 is connected to the base of the transistors 424 and 428. The bias voltage $V_{ref}$ 466 allows the input and the output stages of the TIA 400 to operate in the saturation or the linear regions.

The current $I_{in}+I_{bias}$ conducts through the transistor 416. If the transistors 416 and 420 have equal size, the current conducting through the transistor 420 will also be equal to $I_{bias}+I_{in}$. A variable offset current $I_{offset}$ 440 is supplied to the transistor 420. The variable offset current $I_{offset}$ 440 provides a programmable current used to tune the current in the variable resistor 436. The current in the variable resistor 436 is $I_{out}=I_{bias}+I_{in}-I_{offset}$.

Ideally, $I_{offset}$ 440 would be equal to $I_{bias}$ 432 so that only $I_{in}$ (i.e., the signal current) flows in the resistor 436, which significantly improves the dynamic range of the TIA 400 especially in a situation where $I_{in}$ 408 is much smaller than $I_{bias}$ 432. In another embodiment of the TIA, $I_{offset}$ can be used to correct mismatches between the transistors in the TIA and thereby provide improved accuracy in the current to voltage conversion.

As will be appreciated, when $I_{in}$ 408 increases, the current through the transistor 420 also increases. In existing current mirrors, the current through the resistor 436 will also increase, causing the voltage $V_{res}$ 438 to become too low. In the TIA 400, however, the variable current $I_{offset}$ 440 and the variable resistor 436 value can both be adjusted, thereby increasing the voltage $V_{res}$ 438 yet at the same time maintaining the required current level through the transistor 420. As will be appreciated, an increase in $I_{offset}$ 440 causes the current through the resistor to decrease, thereby reducing the voltage drop across the resistor 436 and increasing Vres 438. Thus, when the input current Iin 408 increases, the offset current $I_{offset}$ 440 can also be increased, thereby preventing $V_{res}$ 438 from becoming too low. When the value of the resistor 436 is increased, $V_{res}$ 438 decreases and vice versa. Thus, the resistor value 436 can also be adjusted accordingly for proper operation of the TIA.

When $I_{in}$ 408 decreases, the current through the transistor 420 also correspondingly decreases. In existing current mirrors, the current through resistor 436 will also decrease, causing the voltage $V_{res}$ 438 to become too high. In the TIA 400, the variable current $I_{offset}$ 440 and the variable resistor 436 can both be adjusted, thereby reducing the voltage $V_{res}$ 438 yet at the same time maintaining the required current level through the transistor 420. Thus, the variable resistor 436 and the variable current $I_{offset}$ 440 allows the TIA 400 to operate within a wider range of input current $I_{in}$ 408.

In one embodiment of the invention that is useful especially for very low input current $I_{in}$ 408, the offset current $I_{offset}$ 440 can be tied to the node 438 allowing higher current through the transistor and improved bandwidth given that the current in the transistor 428 is $I_{in}+I_{bias}$.

A NMOS transistor 444 and the bias current $I_{bias2}$ 446 form a feedback loop in the input stage of the current mirror. Due to this feedback loop, the input impedance at the node 410 as seen by the photo detector 404 is low. Accordingly, the bandwidth of the input stage is large and thus high speed signal can pass through the input stage without being filtered.

The output stage of the current mirror comprises the transistors 420, 428 and the variable resistor 436. In order to reduce the impedance of the output stage, a bipolar driver stage comprising a bipolar transistor 448 and a bias current $I_{bias3}$ 452 is added to the output stage. Since the bipolar transistor 448 has a lower impedance (looking into the emitter of the bipolar transistor) than a CMOS-type transistor (looking into the source of the CMOS transistor), the output impedance at the output node 456 of the TIA 400 is low. The bipolar driver stage allows the TIA 400 to drive loads with high parasitic capacitance.

In one example implementation of the TIA 400, the values associated with various elements are as follows:
(1) R 436 value may be a few hundred Ohms to 1K Ohm.
(2) $V_{dd}$ 434 value may be 2.97V to 3.63V
(3) $I_{bias}$ 432=1.2 mA
(4) $I_{bias2}$ 446=500 uA
(5) $I_{bias3}$ 452=500 uA
(6) $I_{offset}$ 440=1 mA +/−50%
(7) $C_{par}$ 412 value may be 2 pF to 15 pF It will be understood by those skilled in the art that the above values are provided as examples only, and other values can be used to implement the TIA. The implementations of $I_{bias}$, $I_{bias2}$, $I_{bias3}$, Ioffset and variable resistor R are well understood by those skilled in the art, and thus will not be described here.

In one embodiment, a second programmable current source can be used in parallel to the variable current $I_{offset}$ 440. The second programmable current source can be used during power-up of the TIA 400 to eliminate any offset voltage at the output of the TIA 400 due to components mismatch or process variation.

Since the characteristics of the photo detector 404 is known, using a programmable variable resistor 436 and a programmable variable current $I_{offset}$ 440, a user can adjust the values of the variable resistor 436 and the $I_{offset}$ 440 to obtain a desired output voltage swing.

As discussed before, due to variations in process and manufacture, the TIA 400 can generate output errors such as its output voltage can be slightly higher or lower than expected. If the error is not corrected, a comparator circuit that compares the TIA output to a reference voltage will also generate an error. The programmability of the TIA 400 discussed before allows the errors to be corrected.

Figure 5:
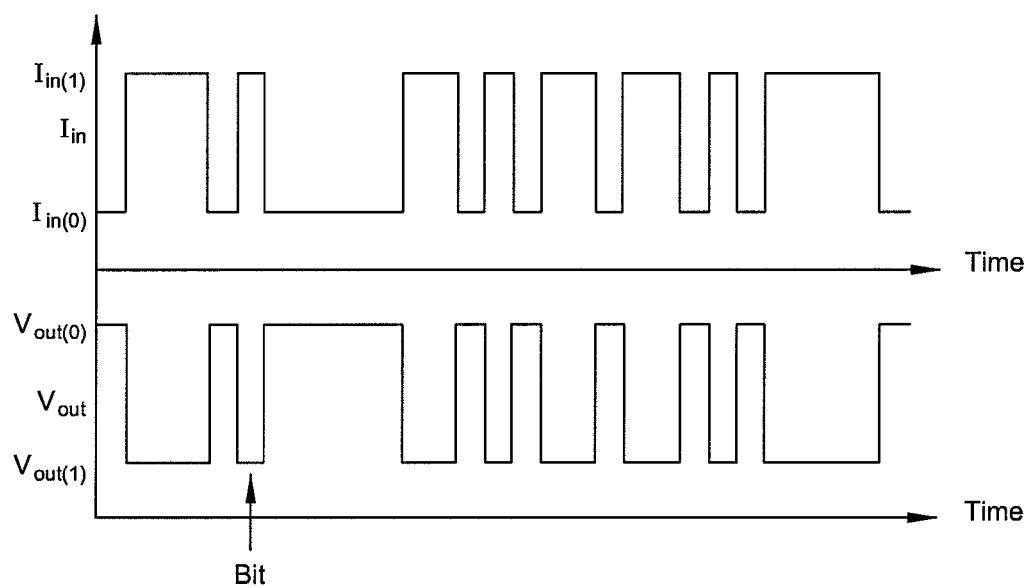
FIG. 5 shows an example input current and an output voltage signal.

FIG. 5A shows an example input current signal Iin 408 provided to the TIA 400 and an output voltage signal Vout generated by the TIA 400. $I_{in}(1)$ is the input current corresponding to a level 1 and $I_{in}(0)$ is the input current corresponding to a level 0. Note that when Iin is at level 1, Vout is at level 0, and when Iin is at level 0, Vout is at level 1.

Figure 6:
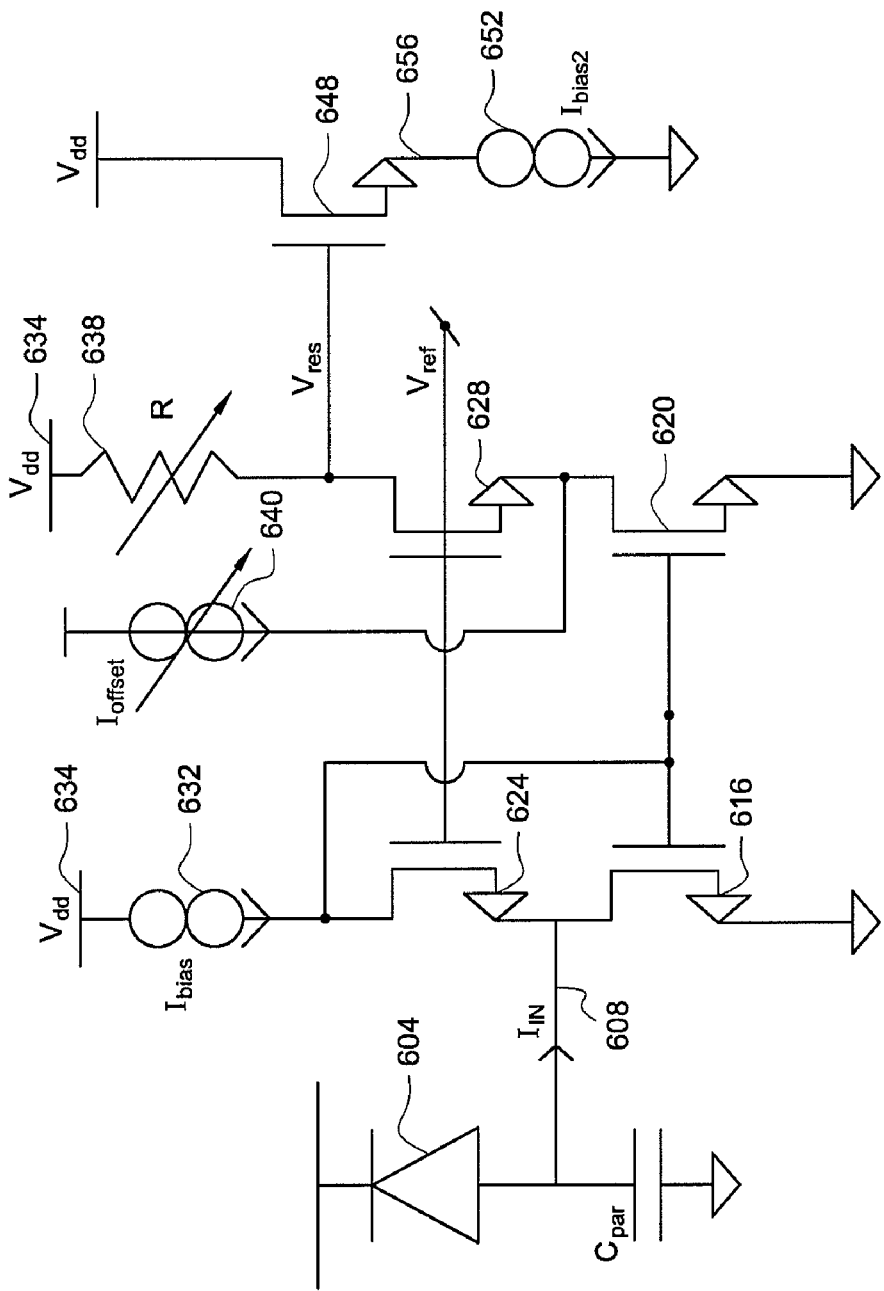
FIG. 6 is a TIA in accordance with another embodiment of the invention.

FIG. 6 shows a TIA 600 in accordance with another embodiment of the invention. As will be appreciated, the transistors in the TIA 600 are CMOS-type transistors. Unlike the TIA 400 shown in FIG. 4, the TIA 600 lacks a feedback transistor in the input stage.

In operation, a photo detector 604 generates a current $I_{in}$ 608 responsive to light emitted by a LED (not shown in FIG. 6). The current Iin 608 is received by a current mirror formed by 4 CMOS transistors 616, 620, 624, and 628. As will be appreciated, the current mirror includes an input stage formed by the transistors 616 and 624 and an output stage formed by the transistors 620 and 628.

Figure 1:
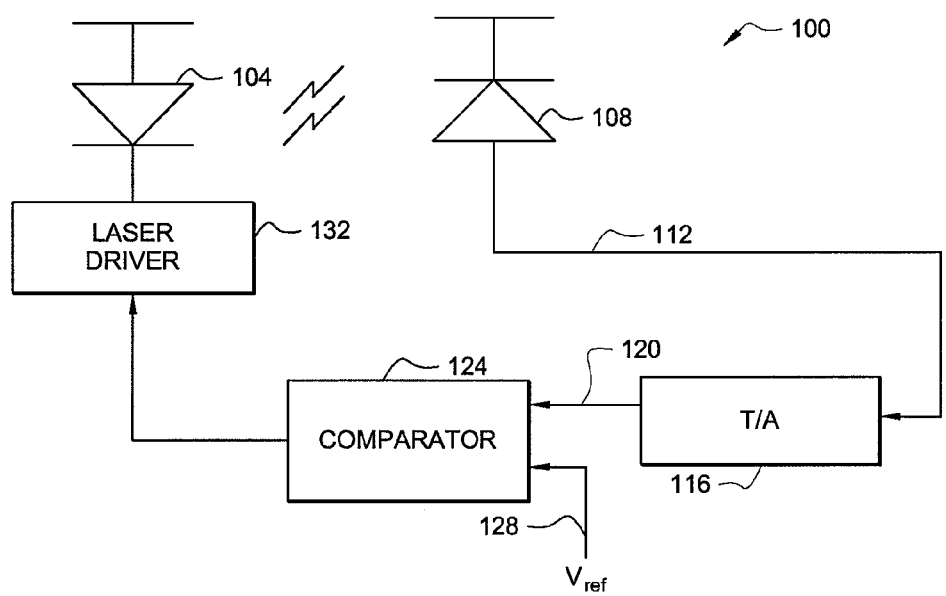
FIG. 1 is a Power Control Loop.
Figure 2:
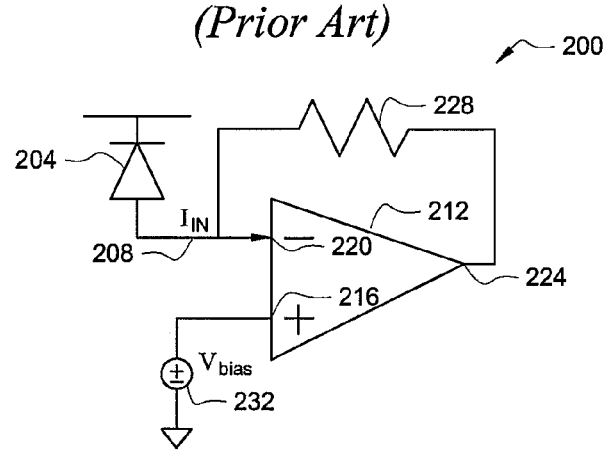
FIG. 2 is a Trans-Impedance Amplifier (TIA) with a high gain differential amplifier and a negative feedback loop.
Figure 3:
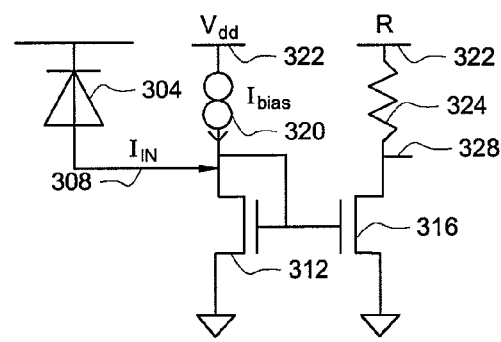
FIG. 3 is a TIA implemented with a current mirror.

A first bias current $I_{bias}$ 632 is provided to the transistor 624 for proper operation of the current mirror. A variable resistor 638 couples the transistor 628 to a supply voltage $V_{dd}$ 634. A variable offset current $I_{offset}$ 640 provides a programmable current to tune the current flowing through the variable resistor R 638. An output driver stage comprising transistor 648 and a second bias current $I_{bias2}$ 652 lowers the output impedance of the TIA 600. The output of the TIA 600 is provided at the node 656. An advantage of the TIA 600 is that its input impedance is significantly lower than the simple current mirror-type TIA shown in FIG. 3. As will be understood by those skilled in the art, the input impedance of the TIA in FIG. 3 is 1/gm, wherein gm is the transconductance of the transistor 312. In contrast, the input impedance of the TIA 600 is (1/gm1)/(gm2*Z2), where gm1 is the trans-conductance of the transistor 624, gm2 is the trans-conductance of transistor 616 and Z2 is the output impedance seen looking at the drain of the transistor 624 when the loop is open.

It will be appreciated by those skilled in the art that changes could be made to the embodiments described above without departing from the broad inventive concept thereof. For example, the TIAs can be implemented with only CMOS-type transistors or with only bipolar-type transistors, or using both CMOS and bipolar type transistors. It is understood, therefore, that this invention is not limited to the particular embodiments disclosed, but it is intended to cover modifications within the spirit and scope of the present invention as defined by the appended claims.

We claim:

1. A trans-impedance amplifier configured to receive an input current and operable to generate an output voltage responsive to the input current, the amplifier responsive to an increased range of input currents and having a wide bandwidth, comprising:
    an input stage having a first and a second transistor connected in series, the input stage coupled between a supply voltage and ground and configured to receive the input current;
    an output stage coupled to the input stage, the output stage having a third and a fourth transistor connected in series, the output stage coupled between the supply voltage and ground;
    a feedback loop coupled to the input stage, the feedback loop operable to reduce the input impedance of the amplifier;
    a variable resistor connected in series with the third and fourth transistors and the supply voltage, the variable resister being operable to adjust the current in the output stage;
    a variable current source being operable to supply a variable current to the output stage, wherein an increase in the variable current by the variable current source causes a decrease in the current flowing through the variable resistor and wherein a decrease in the variable current by the variable current source causes an increase in the current flowing through the variable resistor; and
    an output driver having at least a fifth transistor coupled to the output stage and being operable to provide the output voltage and to reduce the output impedance of the amplifier.

2. The trans-impedance amplifier of claim 1, wherein the input current is provided by a photo detector.

3. The trans-impedance amplifier of claim 1, wherein variable resistor couples a supply voltage source to the output stage.

4. The trans-impedance amplifier of claim 1, further comprising a first bias current coupled to the input stage and operable to bias the input stage.

5. The trans-impedance amplifier of claim 1, further comprising a second bias current coupled to the feedback loop and operable to bias the feedback loop.

6. The trans-impedance amplifier of claim 1, further comprising a third bias current operable to bias the output driver.

7. A control circuit configured to control a light emitting device (LED) comprising:
   a photo detector operable to generate an input current responsive to light emitted by the LED;
   a trans-impedance amplifier configured to receive the input current and operable to generate a first output voltage responsive to the input current, the trans-impedance amplifier comprising:
   an input stage having a first and a second transistor connected in series, the input stage coupled between a supply voltage and ground and configured to receive the input current;
   an output stage coupled to the input stage, the output stage having a third and a fourth transistor connected in series, the output stage coupled between the supply voltage and ground;
   a feedback loop coupled to the input stage, the feedback loop operable to reduce the input impedance of the amplifier;
   a variable resistor connected in series with the third and fourth transistors and the supply voltage, the variable resister being operable to adjust the current the output stage;
   a variable current source being operable to supply a variable current to the output stage, wherein an increase in the variable current by the variable current source causes a decrease in the current flowing through the variable resistor and wherein a decrease in the variable current by the variable current source causes an increase in the current flowing through the variable resistor;
   an output driver having at least a fifth transistor coupled to the output stage and being operable to provide the first output voltage and to reduce the output impedance of the amplifier;
   a comparison circuit configured to receive the first output voltage and a reference voltage, and operable to generate a second output voltage; and
   a driver circuit configured to receive the second output voltage and operable to generate a control current responsive to the second output voltage, wherein the control current controls the output of the LED.

8. The circuit of claim 7, wherein the trans-impedance amplifier further comprises a first bias current coupled to the input stage and operable to bias the input stage.

9. The circuit of claim 7, wherein the trans-impedance amplifier further comprises a second bias current coupled to the feedback loop and operable to bias the feedback loop.

10. The circuit of claim 7, wherein the trans-impedance amplifier further comprises a third bias current operable to bias the output driver.

11. A trans-impedance amplifier configured to receive an input current and operable to generate an output voltage responsive to the input current, the amplifier responsive to an increased range of input currents and having a wide bandwidth, comprising:
   an input stage having a first and a second transistor connected in series, the input stage coupled between a supply voltage and ground and configured to receive the input current;
   an output stage coupled to the input stage, the output stage having a third and a fourth transistor connected in series, the output stage coupled between the supply voltage and ground;
   a variable resistor connected in series with the third and fourth transistors and the supply voltage, the variable resister being operable to adjust the current in the output stage;
   a variable current source being operable to supply a variable current to the output stage, wherein an increase in the variable current by the variable current source causes a decrease in the current flowing through the variable resistor and wherein a decrease in the variable current by the variable current source causes an increase in the current flowing through the variable resistor; and
   an output driver having at least a fifth transistor coupled to the output stage and being operable to provide the output voltage and to reduce the output impedance of the amplifier.

12. The trans-impedance amplifier of claim 11, wherein the input current is provided by a photo detector.

13. The trans-impedance amplifier of claim 11, wherein the variable resistor couples a supply voltage source to the output stage.

14. The trans-impedance amplifier of claim 11, wherein the photo detector is optically coupled to a light emitting device (LED).

15. The trans-impedance amplifier of claim 11, further comprising a first bias current coupled to the input stage and operable to bias the input stage.

16. The trans-impedance amplifier of claim 11, further comprising a third bias current operable to bias the output driver stage.

* * * * *